US005789843A

United States Patent [19]
Higuchi et al.

[11] Patent Number: 5,789,843
[45] Date of Patent: Aug. 4, 1998

[54] ELECTROSTATICALLY LEVITATED CONVEYANCE APPARATUS AND ELECTRODE THEREOF FOR ELECTROSTATIC LEVITATION

[75] Inventors: Toshiro Higuchi, Yokohama; Ju Jin, Kawasaki; Manabu Kanemoto, Ohmiya, all of Japan

[73] Assignees: Kanagawa Academy of Science and Technology; Mitsubishi Materials Corporation, both of Japan

[21] Appl. No.: 535,246

[22] PCT Filed: Mar. 17, 1995

[86] PCT No.: PCT/JP95/00470

§ 371 Date: Oct. 30, 1995

§ 102(e) Date: Oct. 30, 1995

[87] PCT Pub. No.: WO95/25689

PCT Pub. Date: Sep. 28, 1995

[30] Foreign Application Priority Data

Mar. 18, 1995 [JP] Japan .................. 6-048175

[51] Int. Cl.⁶ .................. H02N 2/00; H02N 2/02; H02N 2/06
[52] U.S. Cl. .................. 310/309
[58] Field of Search .................. 310/308, 309

[56] References Cited

U.S. PATENT DOCUMENTS 3,961,000 6/1976 Ferriss et al. .................. 318/116
4,943,750 7/1990 Howe et al. .................. 310/309

FOREIGN PATENT DOCUMENTS

| 2164288 | 6/1990 | Japan . |
| 4372152 | 12/1992 | Japan . |
| 522960 | 1/1993 | Japan . |
| 56933 | 1/1993 | Japan . |
| 6143075 | 5/1994 | Japan . |

*Primary Examiner*—Clayton E. Laballe
*Attorney, Agent, or Firm*—Lorusso & Loud

[57] ABSTRACT

An electrostatic levitating electrode (10) is split into four equal segments on a circular insulating substrate (4) with isolating strips (11a, 11b) interposed between them. A positive voltage and a negative voltage are alternately applied to these four electrodes (10a, 10b, 10c, 10d), which are sector-shaped. In order to prevent the concentration of electric charge in such case, the corner portions of the sector-shaped electrodes (10a, 10b, 10c, 10d) are formed to have roundness (13). Furthermore, a lead wire (12a) is connected to the outer side of the sector-shaped electrode (10a), a lead wire (12b) is connected to the outer side of the sector-shaped electrode (10b), a lead wire (12c) is connected to the outer side of sector-shaped electrode (10c), and a lead wire (12d) is connected to the outer side of sector-shaped electrode (10d). Accordingly, the maximum attraction force and levitational rigidity are increased without damage to electrodes at lead portions and it possible to convey a levitated body with accuracy.

11 Claims, 9 Drawing Sheets

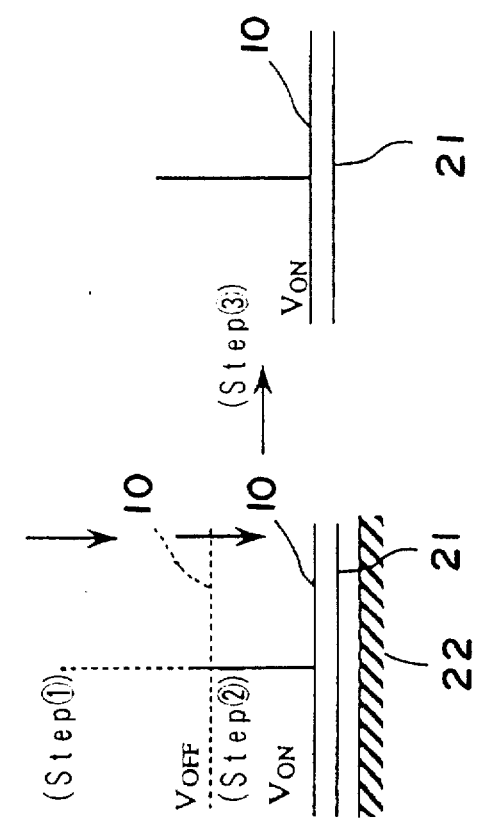
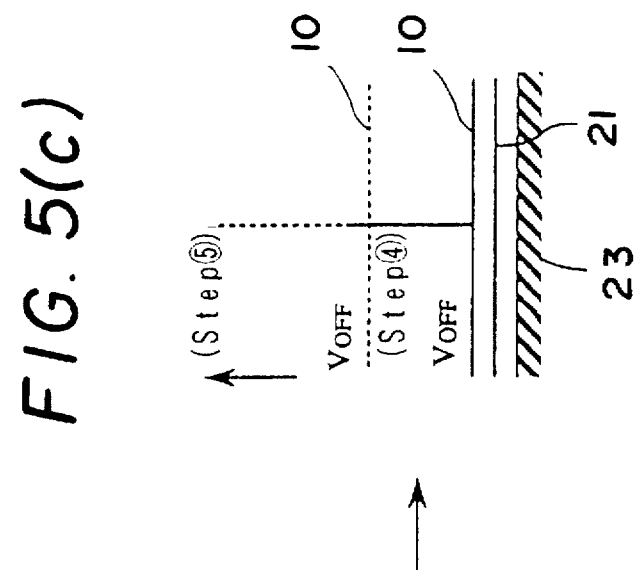
FIG. 5(a)   FIG. 5(b)   FIG. 5(c)

5,789,843

ELECTROSTATICALLY LEVITATED CONVEYANCE APPARATUS AND ELECTRODE THEREOF FOR ELECTROSTATIC LEVITATION

TECHNICAL FIELD

This invention relates to an electrostatically levitated conveyance apparatus which uses electrostatic attraction force, as well as an electrode of the apparatus for the purpose of electrostatic levitation.

BACKGROUND ART

An example of the prior art in this field has been disclosed in the specification of Japanese Patent Application Laid-Open No. 5-22960.

FIGS. 1(a) through 1(c) illustrate this example of the prior art, which is a guide support mechanism of an electrostatically levitated linear motor.

As shown in FIGS. 1(a) through 1(c), a plurality of drive electrodes 102 for generating a driving force and a plurality of levitating electrodes 103 for non-contact support of a movable element 104 are formed on the surface of a stator 101. Respective ones of driving electrodes 105 and levitating electrodes 106 are formed on the surface of the movable element 104, which opposes the stator 101. By applying a voltage across the levitating electrodes 106 of the movable element 104 and the levitating electrodes 103 of the stator 101, the movable element 104 is levitated without contact. The movable element 104 is moved in the levitated state by applying a voltage across the drive electrodes 105 of the movable element 104 and the drive electrodes 102 of the stator 101.

More specifically, the drive electrodes 102 have the form of a plurality of comb teeth arrayed at a first prescribed pitch in a direction perpendicular to the traveling direction A-A' of the movable element 104, and the teeth are connected by a lead wire 102b from a feeder terminal 102a so as to attain the same potential. The levitating electrodes 103 are four somewhat elongated band-shaped bodies extending along the traveling direction A-A' outside the drive electrodes 102 and are provided with DC voltage from respective feeder terminals 103a. The drive electrodes 105 have the form of a plurality of comb teeth arrayed at a second prescribed pitch in a direction perpendicular to the traveling direction A-A' of the movable element 104, and the teeth are connected by a lead wire 105b from a feeder terminal 105a so as to attain the same potential. The levitating electrodes 106 are four rectangular bodies placed at the four corners of the movable electrode 104 along the traveling direction A-A' thereof outside the drive electrodes 105 and are connected by a lead wire 106b so as to attain the same potential. A DC voltage is applied to the levitating electrodes 106 from a feeder terminal 106a.

However, a problem with this prior-art guide support mechanism of an electrostatically levitated linear motor is that the levitating electrodes and drive electrodes are separate from each other, as a result of which the area of the electrode plates cannot be utilized effectively. Since the electrostatic force is directly proportional to the electrode area, a large levitating force cannot be obtained for levitation and there is a decline in the levitational rigidity as well.

In addition, the lead wires of the drive electrodes are interposed between the levitating electrodes and the drive electrodes and are easily destroyed by electrical discharge.

Furthermore, since it is necessary to form the electrodes on the body to be conveyed, the body cannot be conveyed as is.

An extremely clean working environment is presently required in various fields, such as in the semiconductor and precision equipment industries. To raise the degree of cleanliness, the elimination of dust is demanded as well as the development of non-contact conveyance mechanisms, which do not rely upon mechanical contact, in order to prevent the generation of dust.

The inventors have conducted extensive research with regard to electrostatic levitation by controlling DC voltage in order to develop a mechanism in which plate-shaped objects such as silicon wafers are handled and conveyed without contact.

FIG. 2 illustrates an example of the structure of an electrostatic levitation apparatus for levitating a plate-shaped object.

As shown in FIG. 2, a voltage applied to an electrode 1 on an insulating substrate 4 is controlled in such a manner that an electrostatic attraction force which acts upon a levitated body 2 across a prescribed gap will counterbalance the weight of the levitated body 2, thereby levitating the body 2 without any physical contact. In order to achieve perfect contactless levitation, it is required that the motion of the levitated body 2 be constrained from five directions. The electrode 1 usually is divided into a number of segments.

FIG. 3 is a plan view illustrating a conventionally employed electrode for electrostatic levitation.

As shown in FIG. 3, the overall electrode is divided into four segments. Specifically, three electrodes 6a, 6b, 6c arranged equidistantly on the outer side are identical in shape and area and form a single ring. A center electrode 6d has the shape of a circular disk and an area which is the sum of the areas of the three outer electrodes. Voltages having the same polarity (a positive potential, for example) are applied upon the three outer electrodes 6a, 6b, 6c, and a voltage of the opposite polarity (a negative potential, for example), is applied to the center electrode 6d. In order to hold the net potential of a levitated body (not shown) at zero volts, the absolute value of the voltage applied to the center electrode 6d is the average value of the voltages applied to the three outer electrodes.

Voltage is applied to the center electrode 6d by a lead wire 7a, and voltage is applied to the surrounding electrodes 6a, 6b, 6c by lead wires 8a, 8b, 8c, respectively.

It is known that the following problems arise with this electrode arrangement for electrostatic levitation according to the prior art:

(a) The lead wire 7a is interposed between the outer electrodes 6a and 6b. If the gaps between these electrodes and the lead wire are small, a destructive discharge is easily produced between the electrodes and the lead wire and the lead wire may break easily, thus rendering the overall electrode useless. If the electrode is made of a thin, vapor-deposited film, this is particularly problematic. In order to solve this problem, a conventional method is to enlarge the gaps between the electrodes and the lead wire. However, enlarging the gaps reduces the area of the electrode, thereby diminishing the maximum electrostatic attraction force as well as the levitational rigidity.

(b) The area of the center electrode 6d is three times that of the outer electrode 6a. This means that if a voltage of the same value is applied, the current which flows through the lead wire 7a of the center electrode 6d is three times the current the flows through the lead wire 8a of the outer electrode 6a. The lead wire 7a is easily destroyed by the heat produced by resistance. This problem becomes particularly pronounced if the electrode is made of a thin, vapor-deposited film.

3

The present invention seeks to solve the aforesaid problems and its object is to provide a highly reliable electrostatically levitated conveyance apparatus, as well as an electrode for achieving the electrostatic levitation, in which the maximum electrostatic attraction force and levitational rigidity are raised without damage to electrodes at lead portions, thus making it possible to convey a levitated body with accuracy.

DISCLOSURE OF THE INVENTION

According to the present invention, an electrostatically levitated conveyance apparatus using electrostatic attraction force comprises an electrostatic levitating electrode having an electrode to which a positive voltage is applied and an electrode to which a negative voltage is applied, the electrodes being separated and arranged uniformly on an insulting substrate, and lead wires led out from all of the electrodes from an outer side or underside thereof; a levitated body opposing the electrostatic levitating electrode; a displacement sensor for sensing a gap between the electrostatic levitating electrode and the levitated body; and a controller for controlling voltage applied to the electrostatic levitating electrode; wherein the levitated body is attracted, held and conveyed without contact by electrostatic attraction force owing to application of voltage to the electrostatic levitating electrode, the levitated body being released from the electrostatic levitating electrode by cutting off the voltage to the electrostatic levitating electrode when the levitated body arrives at a predetermined position. As a result, the maximum attraction force and levitational rigidity are raised without damage to electrodes at lead portions, thus making it possible to convey a levitated body with accuracy.

Further, the electrostatic levitating electrode comprises electrodes separated uniformly into multiple, e.g., four, segments on an insulating substrate and supplied alternately with positive voltage and negative voltage, and lead wires led out from all of the electrodes from an outer side or underside thereof. As a result, there is no severance of a lead wire due to destructive discharge between electrodes and the lead wire, and there is no damage to an electrode at the lead portions due to excessive current flowing through the lead wire of the center electrode. This makes it possible to apply voltage reliably.

BRIEF DESCRIPTION OF THE DRAWINGS

FIG. 5(a) is a diagram showing a first step of conveyance of a silicon wafer by the electrostatically levitated conveyance apparatus of the present invention;

FIG. 5(b) is a diagram showing a second step of conveyance of a silicon wafer by the electrostatically levitated conveyance apparatus of the present invention;

FIG. 5(c) is a diagram showing a third step of conveyance of a silicon wafer by the electrostatically levitated conveyance apparatus of the present invention;

BEST MODE FOR CARRYING OUT THE INVENTION:

Embodiments of the present invention will now be described in detail with reference to the drawings.

A first embodiment will now be described with reference to FIGS. 4 and 5.

Figure 1A:
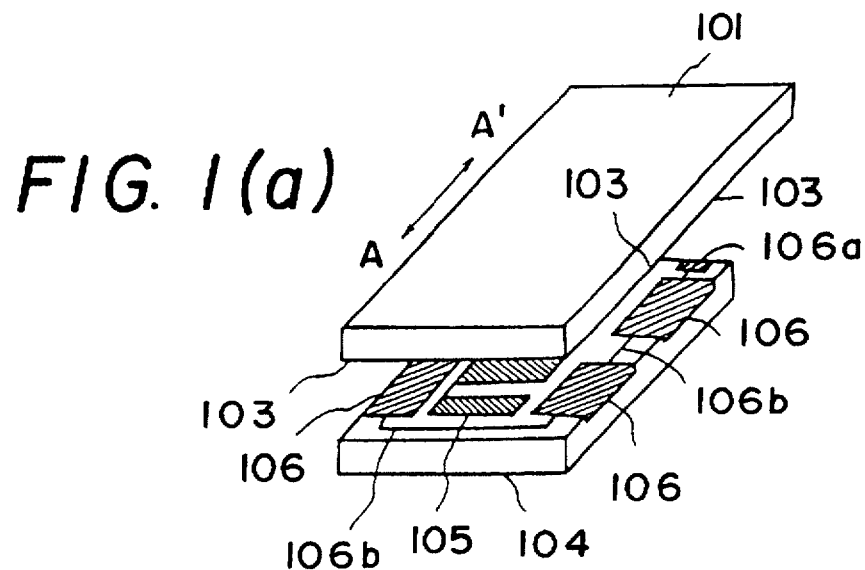
FIG. 1(a) is a perspective view of a guide support mechanism of an electrostatically levitated linear motor according to the prior art.
Figure 1B:
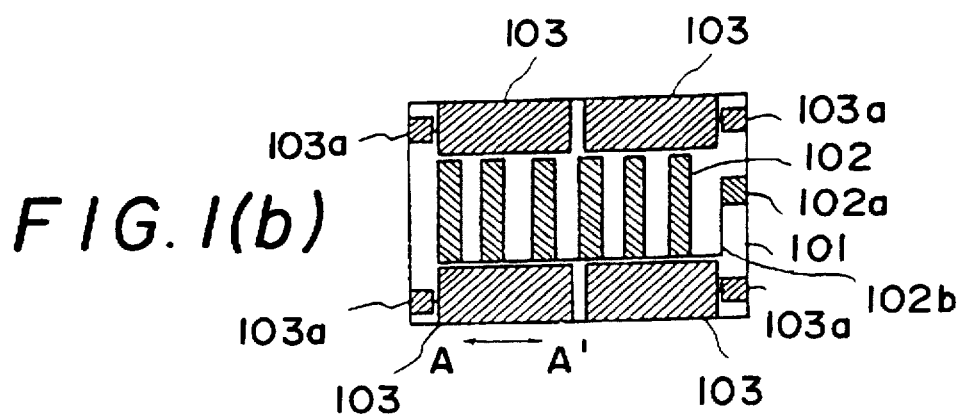
FIG. 1(b) is a plan view showing a stator in the electrostatically levitated linear motor according to the prior art.
Figure 1C:
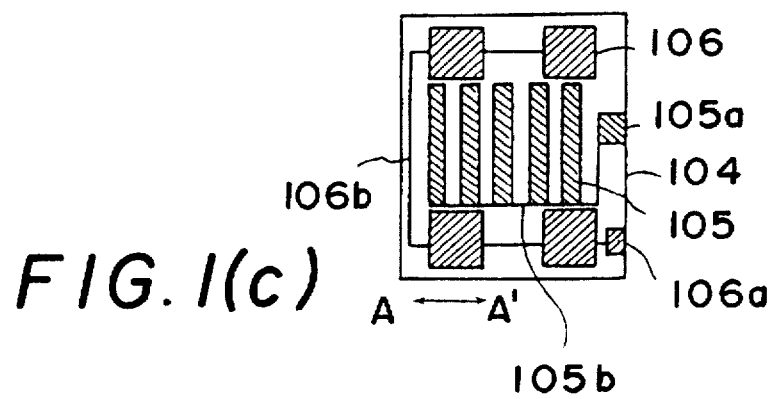
FIG. 1(c) is a plan view of a movable element in the electrostatically levitated linear motor according to the prior art.
Figure 2:
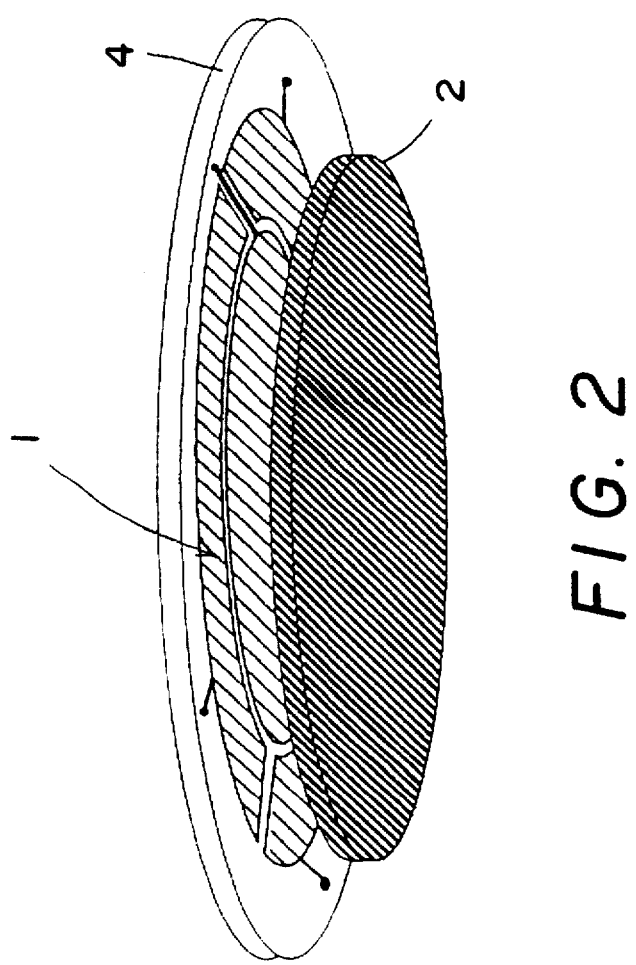
FIG. 2 is a diagram showing an example of the structure of the electrostatically levitated linear motor according to the prior art.
Figure 3:
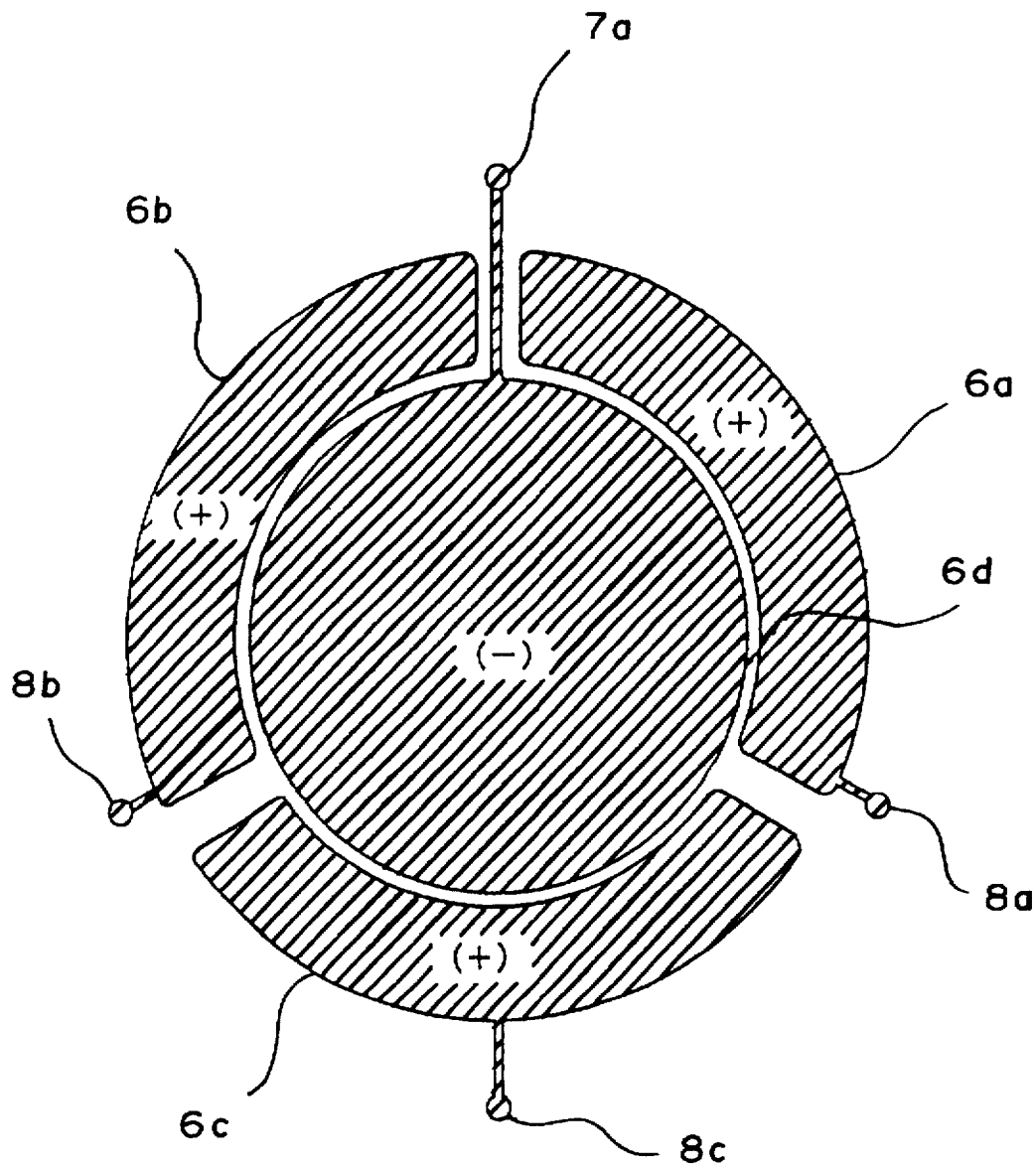
FIG. 3 is a plan view showing an electrostatic levitating electrode according to the prior art.
Figure 4:
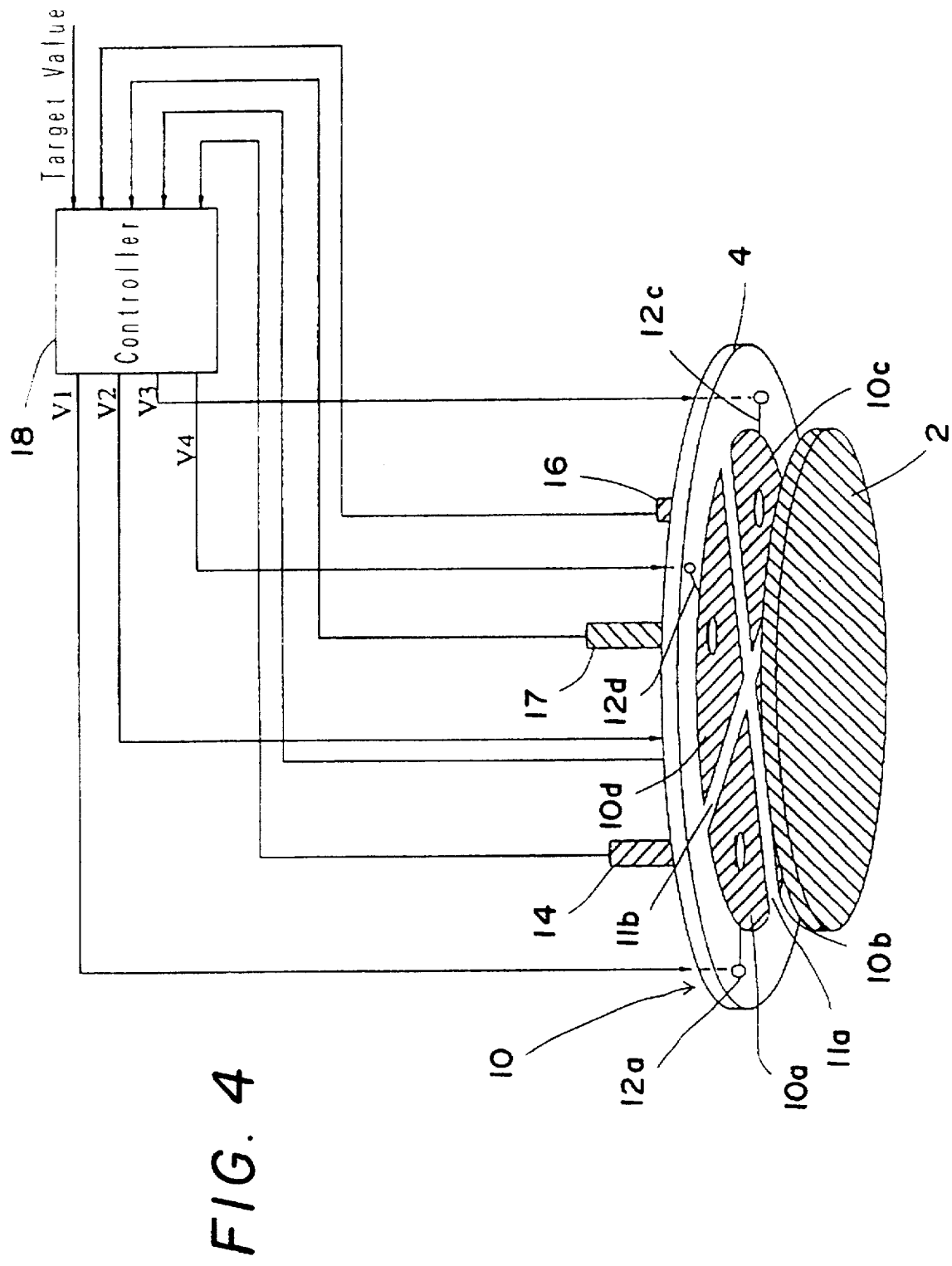
FIG. 4 is a diagram showing the general construction of an electrostatically levitated conveyance apparatus illustrating a first embodiment of the present invention.

As shown in FIG. 4, a circular insulating substrate 4 is provided with an electrostatic levitating electrode 10 obtained by arranging four uniformly split sector-shaped electrodes 10a, 10b, 10c 10d on the substrate with isolating strips 11a, 11b disposed between them.

A positive voltage and a negative voltage are applied to alternate electrodes of the four sector-shaped electrodes 10a, 10b, 10c, 10d so that each pair of adjacent electrodes are energized by opposite polarity voltages. In order to prevent the concentration of electric charge in such case, the corner portions of the sector-shaped electrodes 10a, 10b, 10c, 10d are formed to have roundness. Furthermore, a lead wire 12a is connected to the outer side of sector-shaped electrode 10a, a lead wire 12b (not shown) is connected to the outer side of sector-shaped electrode 10b, a lead wire 12c is connected to the outer side of sector-shaped electrode 10c, and a lead wire 12d is connected to the outer side of sector-shaped electrode 10d.

A levitated body 2 is placed so as to oppose the electrostatic levitating electrode 10. A gap between the electrostatic levitating electrode 10 and levitated body 2 is sensed by displacement sensors 14, 15 (not shown), 16 and 17, and the gap is communicated to a controller 18 as a feedback signal. The controller 18 compares its input signal with a target value, processes the error between the input signal and the target value, produces voltage signals V1, V2, V3, V4 necessary for the levitated body to be levitated stably at a target position, and applies these voltage signals to the sector-shaped electrodes 10a, 10b, 10c, 10d, respectively.

Thus, by controlling the voltage applied to the sector-shaped electrodes 10a, 10b, 10c, 10d, the electrostatic attraction force between the sector-shaped electrodes 10a, 10b, 10c, 10d and the levitated body is controlled to levitate the levitated body without any contact.

An example of conveyance of a silicon wafer by this electrostatically levitated conveyance apparatus will now be described with reference to FIG. 5.

(1) As shown in FIG. 5(a), the electrostatic levitating electrode 10 is at an upper position (the position indicated by the dashed line) (step ①). The electrostatic levitating electrode 10 is lowered from this position to approach a levitated body, such as a silicon wafer 21, placed upon a table 22, and is stopped at a predetermined position. The controlled voltage is then applied to the electrostatic levitating electrode 10 to levitate the silicon wafer 21 contactlessly by an electrostatic attraction force (step ②).

In order to levitate a silicon wafer (thickness 550 µm, 9.7 g) having a diameter of 4 in, by way of example, via a gap of 400 µm, an applied voltage of about 914 V is required.

Since the breakdown field in the atmosphere is 3.0 V/µm, voltage can be applied up to a maximum of 1.2 kV with no fear of breakdown in case of the 400 µm gap.

(2) Under these conditions, the electrostatic levitating electrode 10 is moved in the manner shown in FIG. 5 (b), whereby the silicon wafer 21 can be conveyed (step ③).

(3) When the silicon wafer 21 reaches a predetermined conveyance position, as shown in FIG. 5(c), the electrostatic levitating electrode 10 is halted and supply of voltage to the electrostatic levitating electrode 10 is interrupted, whereupon the silicon wafer 21 leaves the electrostatic levitating electrode 10 and is placed upon the table 23 (step ④).

(4) The electrostatic levitating electrode 10 is then moved upward to prepare for the next cycle (step ⑤).

It goes without saying that this is merely one example of an electrostatically levitated conveyance apparatus and that the conveyance process and conveyance positions can be changed in a variety of ways.

An electrostatic levitating electrode used in such an electrostatic levitating apparatus will now be described.

Figure 6:
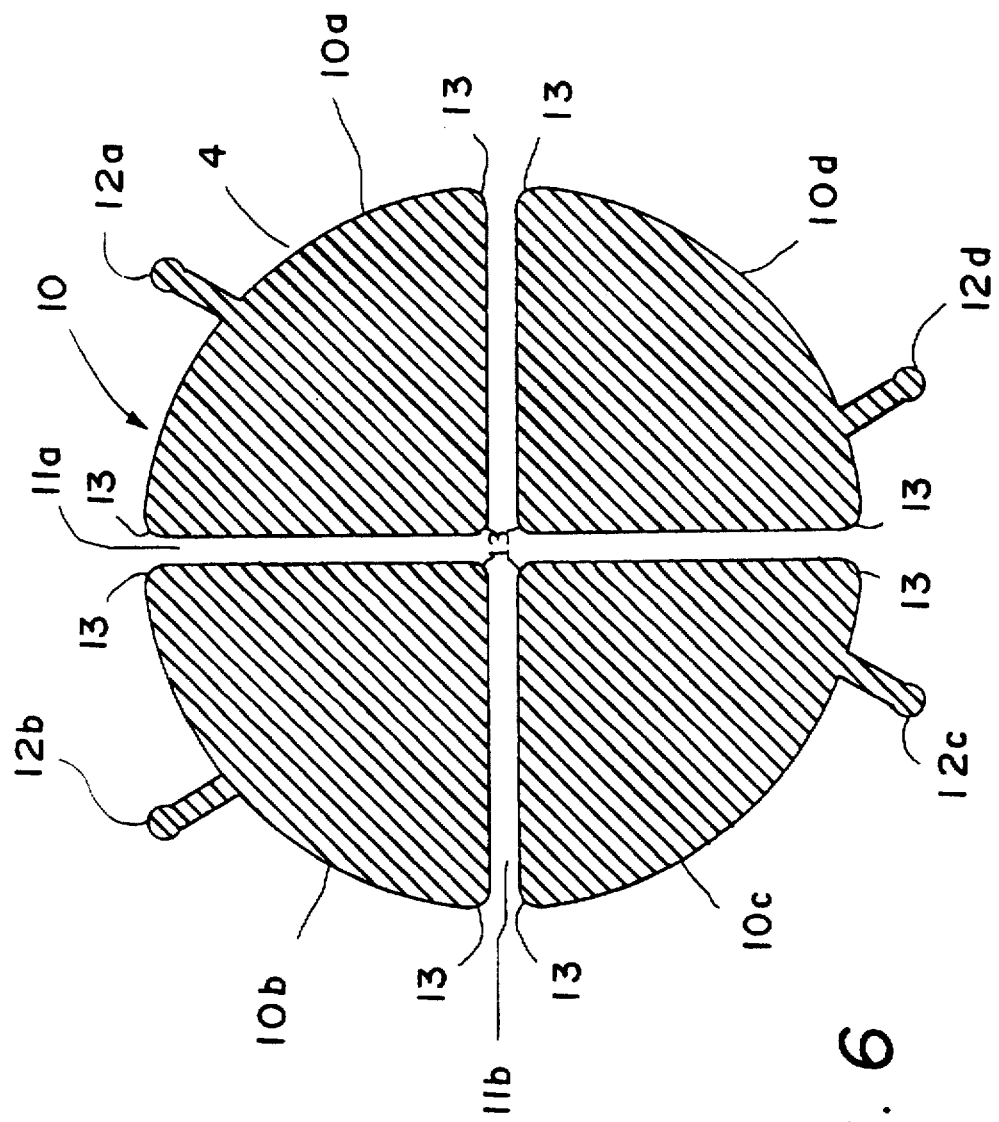
FIG. 6 is a plan view of an electrostatic levitating electrode illustrating a first embodiment of the present invention.

As shown in FIG. 6, the electrostatic levitating electrode 10 of this embodiment comprises a levitated body, such as a silicon wafer, having the external shape of a circular disk, and a circular insulating substrate 4 having the same diameter. Four sector-shaped electrodes 10a, 10b, 10c, 10d of the same shape and area are arranged on the insulating substrate 4 in four equal sections with isolating strips 11a, 11b interposed between them. In other words, the electrostatic levitating electrode 10 is equally divided into four segments by the isolating strips 11a, 11b.

Positive voltage and negative voltage are applied to alternate electrodes of the four sector-shaped electrodes 10a, 10b, 10c, 10d.

Further, the corner portions of the sector-shaped electrodes 10a, 10b, 10c, 10d are formed to have roundness 13 to prevent the concentration of electric charge.

Furthermore, lead wires for applying the aforementioned voltages are connected to the outer sides of the sector-shaped electrodes 10a, 10b, 10c, 10d. Specifically, the lead wire 12a is connected to the outer side of sector-shaped electrode 10a, the lead wire 12b is connected to the outer side of sector-shaped electrode 10b, the lead wire 12c is connected to the outer side of sector-shaped electrode 10c, and the lead wire 12d is connected to the outer side of sector-shaped electrode 10d.

An example of fabrication of the electrode will now be described.

An electrode pattern is formed on a photosensitive substrate by photolithographic etching. The photosensitive substrate is affixed to an insulating substrate having a thickness of 15 mm.

The following is an example of the photolithographic etching conditions:

(1) Exposure: Exposure is performed for three minutes by means of an exposure device for printed circuit boards, after which development is carried out using an organic developing solution.

(2) Etching: A copper foil on the photosensitive substrate is etched using an etching solution specially for the photosensitive substrate, thereby forming an electrode pattern.

(3) Resist peel-off: A resist on the etching pattern is removed by an organic peeling solution.

Figure 7:
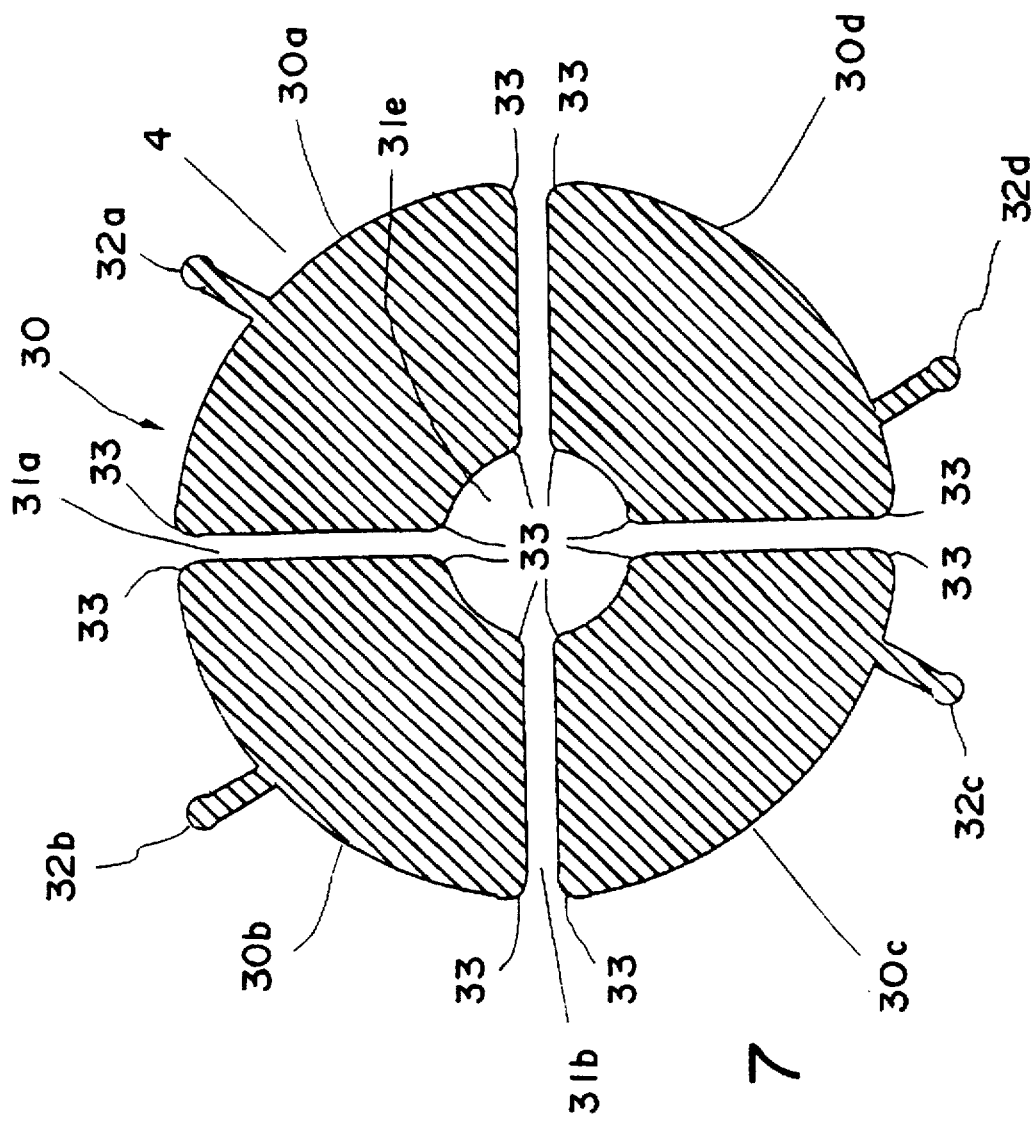
FIG. 7 is a plan view of an electrostatic levitating electrode illustrating a second embodiment of the present invention.
Figure 8:
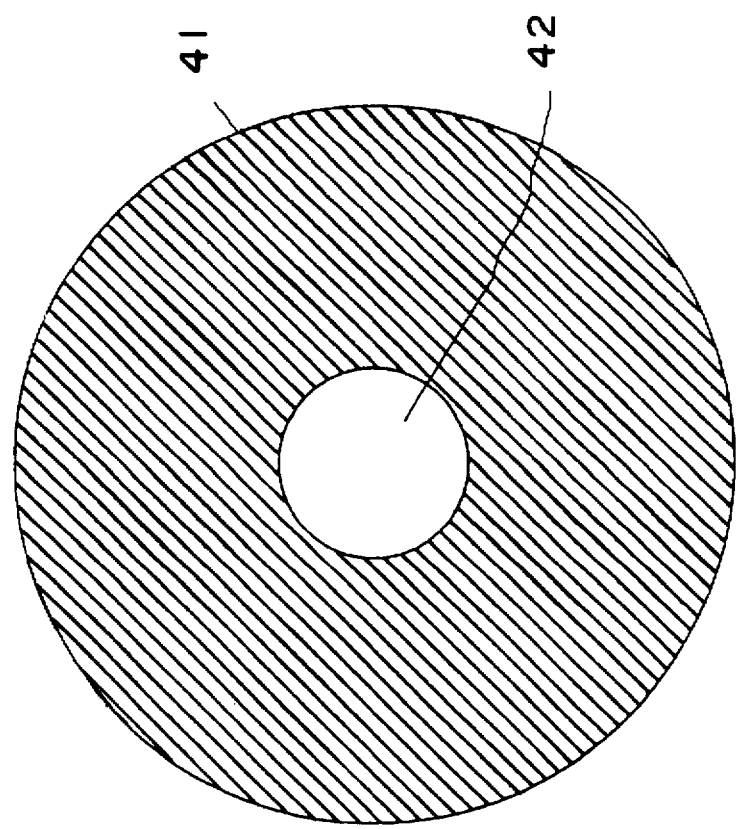
FIG. 8 is a plan view of a disk, which is provided with a hole, serving as an electrostatically levitated body illustrating a second embodiment of the present invention.

As shown in FIG. 7, an electrostatic levitating electrode 30 according to this embodiment can be utilized in the electrostatic levitation of a disk 41 having a hole 42 of the kind shown in FIG. 8.

The electrostatic levitating electrode 30 of this embodiment has approximately the same electrode arrangement as that of FIG. 6 except for the fact that this electrode has a circular isolating area 31e at its center corresponding to the hole 42 of the disk 41. That is, four sector-shaped electrodes 30a, 30b, 30c, 30d are arranged on the circular insulating substrate 4 in four equal sections with isolating strips 31a, 31b and the circular isolating area 31e interposed between them. In other words, the electrostatic levitating electrode 30 is equally divided into four segments by the isolating strips 31a, 31b and circular isolating area 31e.

Positive voltage and negative voltage are applied to alternate electrodes of the four sector-shaped electrodes 30a, 30b, 30c, 30d.

Further, the corner portions of the four sector-shaped electrodes 30a, 30b, 30c, 30d are formed to have roundness 33 to prevent the concentration of electric charge.

Furthermore, lead wires for applying the aforementioned voltages are connected to the outer sides of the sector-shaped electrodes 30a, 30b, 30c, 30d. Specifically, a lead wire 32a is connected to the outer side of sector-shaped electrode 30a, a lead wire 32b is connected to the outer side of sector-shaped electrode 30b, a lead wire 32c is connected to the outer side of sector-shaped electrode 30c, and a lead wire 32d is connected to the outer side of sector-shaped electrode 30d.

Figure 9:
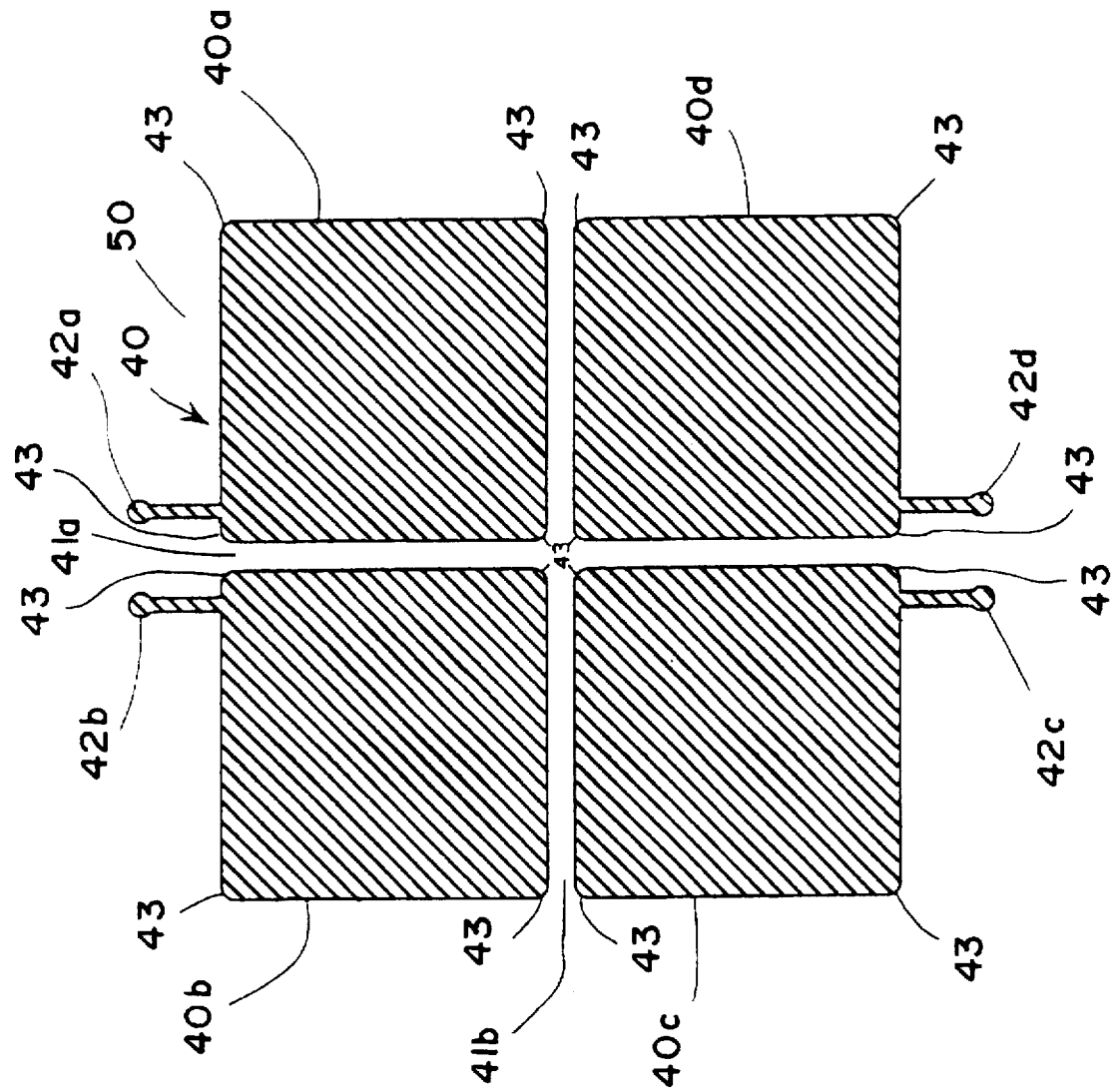
FIG. 9 is a plan view of an electrostatic levitating electrode illustrating a third embodiment of the present invention.

FIG. 9 is a plan view of an electrostatic levitating electrode illustrating a third embodiment of the present invention.

As shown is FIG. 9, the electrostatic levitating electrode of this embodiment is obtained by arranging four square electrodes 40a, 40b, 40c, 40d in four equal sections on a rectangular insulating substrate 50 with isolating strips 41a, 41b interposed between them. In other words, the electrostatic levitating electrode 40 is equally divided into four segments by the isolating strips 41a, 41b.

Positive voltage and negative voltage are alternately applied to the four square electrodes 40a, 40b, 40c, 40d.

Further, the corner portions of the four square electrodes 40a, 40b, 40c, 40d are formed to have roundness 43 to prevent the concentration of electric charge.

Furthermore, lead wires for applying the aforementioned voltages are connected to the outer sides of the square electrodes 40a, 40b, 40c, 40d. Specifically, a lead wire 42a is connected to the outer side of the square electrode 40a, a lead wire 42b is connected to the outer side of the square electrode 40b, a lead wire 42c is connected to the outer side of the square electrode 40c, and a lead wire 42d is connected to the outer side of the square electrode 40d.

The electrostatic levitating electrode 40 thus constructed can be utilized in the electrostatic levitation of a square plate-shaped object.

Though not illustrated, it goes without saying that an electrostatic levitating electrode comprising four rectangular electrodes can be constructed, whereby the electrode can be utilized in the levitation of a rectangular plate-shaped object.

Furthermore, an arrangement may be adopted in which a circular isolating area is formed at the central portion of the above-mentioned electrostatic levitating electrode comprising the square electrodes.

As long as the attraction force and levitational rigidity necessary for levitation are obtained, the shapes of the electrodes can be modified in various ways even if the electrode area is reduced.

Thus, in accordance with the present invention as described in detail above, the maximum attraction force and levitational rigidity are raised without damage to the electrodes at the lead portions, thus making it possible to convey a levitated body with accuracy.

In addition, voltage can be applied to the electrostatic levitating electrode in reliable fashion.

The present invention is not limited to the foregoing embodiments but can be modified in various ways based upon the gist thereof without departing from the scope of the claims.

INDUSTRIAL APPLICABILITY

The present invention is applicable to conveyance apparatuses in extremely clean and vacuum working environments such as in the semiconductor and precision equipment industries.

What is claimed is:

1. An electrostatically levitated conveyance apparatus using DC electrostatic attraction forces from a single side, comprising:
   (a) an electrostatic levitating electrode arrangement having an insulating substrate, an even plurality of electrostatic levitating electrodes which are separated and arranged uniformly on a single side of the insulating substrate, lead wires extending out from all of the electrodes from an outer side or underside thereof, and means for energizing alternate electrodes of said even plurality of electrodes through said lead wires with respective positive and negative voltages so that each pair of adjacent electrodes are energized with opposite polarity voltages;
   (b) a levitated body opposing said electrostatic levitating electrode arrangement;
   (c) a plurality of displacement sensors for sensing gaps between said respective electrostatic levitating electrodes and the levitated body; and
   (d) a controller for controlling the voltages applied to said electrostatic levitating electrodes such that said levitated body is attracted, held and conveyed without contact by electrostatic attraction forces owing to application of the positive and negative DC voltages to said electrostatic levitating electrodes, the levitated body being released from said electrostatic levitating electrodes by cutting off the voltages to said electrostatic levitating electrodes when the levitated body arrives at a predetermined position.

2. An electrostatic levitating apparatus according to claim 1, wherein said levitated body is plate-shaped.

3. A DC electrostatic levitating electrode arrangement of an electrostatically levitated conveyance apparatus, comprising:
   (a) an insulating substrate;
   (b) an even plurality of electrodes which are separated and arranged uniformly on a single side surface of the insulating substrate;
   (c) lead wires extending out from all of said electrodes from an outer side or underside thereof; and
   (d) means for energizing alternate electrodes of said even plurality of electrodes through said lead wires with respective positive and negative DC voltages which have magnitudes controlled inversely in accordance with variations from a predetermined spacing between an article being levitated by said electrodes and said corresponding electrodes.

4. An electrostatic levitating electrode arrangement according to claim 3, wherein said even plurality of electrodes includes four electrodes.

5. An electrostatic levitating electrode arrangement according to claim 3, wherein said even plurality of electrodes together form a circular shape pattern.

6. An electrostatic levitating electrode arrangement according to claim 3, wherein said electrodes are sector-shaped.

7. An electrostatic levitating electrode arrangement according to claim 3, wherein said electrode arrangement has a hole at the center thereof.

8. An electrostatic levitating electrode arrangement according to claim 3, wherein said even plurality of electrodes together from a rectangular shape pattern.

9. An electrostatic levitating electrode arrangement according to claim 8, wherein said rectangular pattern of electrodes is square in shape.

10. An electrostatic levitating electrode arrangement according to claim 8, wherein said electrodes are rectangular in shape.

11. An electrostatic levitating electrode arrangement according to claim 3, wherein corner portions of said electrodes are formed to have roundness.

* * * * *